(12) United States Patent
Yanaru et al.

(10) Patent No.: US 6,577,972 B2
(45) Date of Patent: Jun. 10, 2003

(54) SAMPLING INSPECTION MANAGING SYSTEM

(75) Inventors: Taichi Yanaru, Itami (JP); Masataka Okabe, Itami (JP); Hirofumi Ohtsuka, Itami (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 156 days.

(21) Appl. No.: 09/792,052

(22) Filed: Feb. 26, 2001

(65) Prior Publication Data

US 2002/0029118 A1 Mar. 7, 2002

(30) Foreign Application Priority Data

Aug. 31, 2000 (JP) ........................................ 2000-264104

(51) Int. Cl.[7] .......................... G01N 37/00; G06F 19/00
(52) U.S. Cl. ....................................................... 702/83
(58) Field of Search ............................ 702/81, 83, 182, 702/186; 700/121, 108, 109

(56) References Cited

U.S. PATENT DOCUMENTS

| | | | | |
|---|---|---|---|---|
| 5,164,905 A | * | 11/1992 | Iwasaki et al. | 700/112 |
| 5,274,434 A | * | 12/1993 | Morioka et al. | 356/237.4 |
| 5,463,459 A | * | 10/1995 | Morioka et al. | 356/237.5 |
| 5,654,903 A | * | 8/1997 | Reitman et al. | 702/81 |
| 5,818,716 A | * | 10/1998 | Chin et al. | 700/100 |
| 5,896,294 A | * | 4/1999 | Chow et al. | 700/121 |
| 5,986,263 A | * | 11/1999 | Hiroi et al. | 250/310 |
| 6,131,052 A | * | 10/2000 | Ban et al. | 700/121 |
| 6,166,801 A | * | 12/2000 | Dishon et al. | 355/27 |
| 6,172,365 B1 | * | 1/2001 | Hiroi et al. | 250/310 |
| 6,259,961 B1 | * | 7/2001 | Inoue et al. | 700/112 |
| 6,339,653 B1 | * | 1/2002 | Ishikawa et al. | 382/141 |
| 6,418,355 B1 | * | 7/2002 | Kondou | 700/213 |
| 6,438,438 B1 | * | 8/2002 | Takagi et al. | 700/121 |
| 6,469,518 B1 | * | 10/2002 | Davis et al. | 324/600 |
| 6,477,432 B1 | * | 11/2002 | Chen et al. | 700/51 |

FOREIGN PATENT DOCUMENTS

| | | |
|---|---|---|
| JP | 11-26537 | 1/1999 |
| JP | 11-291144 | 10/1999 |

* cited by examiner

*Primary Examiner*—Kamini Shah
*Assistant Examiner*—Demetrius Pretlow
(74) *Attorney, Agent, or Firm*—Leydig, Voit & Mayer, Ltd.

(57) ABSTRACT

In a sampling inspection managing system, for each processing step, a setting is made on a processing flow table as to whether the processing step concerned is a step for determining the sampling inspection frequency of a specific inspection step. For a processing step which is set as "being a step for determining the sampling inspection frequency", the inspection frequency of the specific inspection step is set on a sampling frequency setting table for every kind of product to be processed. Further, for the processing step, the processing number of lots is counted for every kind of product in a count table, and, on the basis of the processing number thus counted, a judgment is made as to whether each lot is a lot to be inspected in the specific inspection step. The judgment result is stored as information for the lot in a lot table. Accordingly, the inspection can be carried out at an inspection frequency suitable for every kind of product.

5 Claims, 5 Drawing Sheets

FIG. 1

| PRODUCT NAME | STEP | BATCH PROCESSING | SAMPLING INSPECTION | SAMPLING INSPECTION (BATCH PROCESSING) |
|---|---|---|---|---|
| PRODUCT 1 | 0 1 0 0 | | | |
| | 0 1 1 0 | | | |
| | 0 2 0 0 | | | |
| | 0 2 1 0 | | | |
| | 0 3 0 0 | | DETERMINATION | |
| | 0 3 1 0 | | JUDGMENT | |
| | 0 4 0 0 | | | |
| | 0 4 1 0 | | | |
| | 0 5 0 0 | | DETERMINATION | |
| | 0 5 1 0 | | JUDGMENT | |
| | 0 6 0 0 | Y(3lots) | | DETERMINATION (HEAD LOT) |
| | 0 6 1 0 | | | JUDGMENT |
| | 0 7 0 0 | | | |
| | 0 7 1 0 | | | |
| | 0 8 0 0 | | DETERMINATION | |
| | 0 8 1 0 | | JUDGMENT | |
| | 0 9 0 0 | | | |
| | 0 9 1 0 | | | |
| | . | | | |
| | . | | | |

FIG. 2

| PRODUCT NAME | PROCESSING STEP | TYPE | FREQUENCY |
|---|---|---|---|
| PRODUCT 1 | 0 3 0 0 | N | 3 |
| PRODUCT 1 | 0 5 0 0 | N | 2 |
| PRODUCT 1 | 0 6 0 0 | N | 3 |
| PRODUCT 1 | 0 8 0 0 | R | 5 |
| PRODUCT 2 | 0 3 0 0 | N | 2 |
| PRODUCT 2 | 0 4 0 0 | R | 4 |
| PRODUCT 3 | 0 3 0 0 | N | 1 |

TYPE N : lot inspection to be made (1/n lot)
TYPE R : no lot inspection to be made (1/n lot)
(n :integer)

FIG. 3

| PRODUCT NAME | PROCESSING STEP | PROCESSING NUMBER (LOT,BATCH) |
|---|---|---|
| PRODUCT 1 | 0 3 0 0 | 0 |
| PRODUCT 1 | 0 5 0 0 | 0 |
| PRODUCT 1 | 0 6 0 0 | 0 |
| PRODUCT 1 | 0 8 0 0 | 0 |
| PRODECT 2 | 0 3 0 0 | 0 |
| PRODECT 2 | 0 4 0 0 | 0 |
| PRODECT 3 | 0 3 0 0 | 0 |

FIG. 4a

| LOT NUMBER | PRODUCT NAME | SAMPLING INSPECTION | SAMPLING INSPECTION (BATCH PROCESSING) |
|---|---|---|---|
| LOT ① | PRODUCT 1 | × | |
| LOT ② | PRODUCT 1 | × | |
| LOT ③ | PRODUCT 1 | ○ | |
| LOT ④ | PRODUCT 1 | × | |
| LOT ⑤ | PRODUCT 1 | × | |
| LOT ⑥ | PRODUCT 1 | ○ | |
| LOT ⑦ | PRODUCT 1 | × | |
| LOT ⑧ | PRODUCT 1 | × | |
| LOT ⑨ | PRODUCT 1 | ○ | |
| LOT ⑩ | PRODUCT 1 | × | |
| LOT ⑪ | PRODUCT 1 | × | |
| LOT ⑫ | PRODUCT 1 | ○ | |

FIG. 4b

| LOT NUMBER | PRODUCT NAME | SAMPLING INSPECTION | SAMPLING INSPECTION (BATCH PROCESSING) |
|---|---|---|---|
| LOT ① | PRODUCT 1 | | × |
| LOT ② | PRODUCT 1 | | × |
| LOT ③ | PRODUCT 1 | | × |
| LOT ④ | PRODUCT 1 | | × |
| LOT ⑤ | PRODUCT 1 | | × |
| LOT ⑥ | PRODUCT 1 | | × |
| LOT ⑦ | PRODUCT 1 | | ○ |
| LOT ⑧ | PRODUCT 1 | | × |
| LOT ⑨ | PRODUCT 1 | | × |
| LOT ⑩ | PRODUCT 1 | | × |
| LOT ⑪ | PRODUCT 1 | | × |
| LOT ⑫ | PRODUCT 1 | | × |

FIG. 4c

| LOT NUMBER | PRODUCT NAME | SAMPLING INSPECTION | SAMPLING INSPECTION (BATCH PROCESSING) |
|---|---|---|---|
| LOT ① | PRODUCT 1 | ○ | |
| LOT ② | PRODUCT 1 | ○ | |
| LOT ③ | PRODUCT 1 | ○ | |
| LOT ④ | PRODUCT 1 | ○ | |
| LOT ⑤ | PRODUCT 1 | × | |
| LOT ⑥ | PRODUCT 1 | ○ | |
| LOT ⑦ | PRODUCT 1 | ○ | |
| LOT ⑧ | PRODUCT 1 | ○ | |
| LOT ⑨ | PRODUCT 1 | ○ | |
| LOT ⑩ | PRODUCT 1 | × | |
| LOT ⑪ | PRODUCT 1 | ○ | |
| LOT ⑫ | PRODUCT 1 | ○ | |

○ : inspection to be made
× : no inspection to be made

SAMPLING INSPECTION MANAGING SYSTEM

BACKGROUND OF THE INVENTION

1. Field of the Invention

The present invention relates to a sampling inspection managing system for performing inspections of selected lots in a inspection step to check the processing result of a processing step in a semiconductor production line including plural processing steps and inspection steps. The sampling inspection is performed to check whether articles or products are good or defective at an inspection frequency suitable for an inspection purpose for each kind of article or product.

2. The Related Art of the Invention

A production line for semiconductor devices comprises plural processing steps such as a film forming step, a photolithography step, etc., and plural inspection steps such as a film thickness inspecting step, a development inspecting step, etc.

The number of wafers to be processed at one time in each processing step is dependent on the volume processing characteristics of an apparatus being used. For example, twenty five wafers may be set as one lot. In a batch process, plural lots are simultaneously processed when an apparatus having high volume processing characteristics is used. On the other hand, when an apparatus having low volume processing characteristics is used, a lot of wafers or one or several wafers are simultaneously processed. In each processing step, the apparatus to be used, the number of lots or wafers to be processed at one time, the processing conditions, the processing environment, etc., are set in advance in accordance wit the kind of products to be produced.

In each inspection step, the processing result of a processing step preceding the inspection step is checked. In the inspection step, articles or products (goods in process) are checked to determine whether the processing result is good or defective. A 100% inspection for all of the articles or products, or a sampling inspection for sampled articles or products, is made. For example, when a production line is started up to produce new model products or to change the production site, the 100% inspection is performed because no processing result data for processed goods exists for the production facilities, the production environment, and the production conditions. A 100% inspection contains a 100% lot inspection, a 100% in-lot wafers inspection, a 100% in-wafer chip inspection, and a 100% in-chip elements inspection. For example, in the 100% in-lot wafer inspection, all of twenty five wafers constituting one lot are inspected.

On the other hand, in the case of a production line in which production is continuously or intermittently carried out, for a processing step for which it has been confirmed that the production is to be continued with the current processing conditions, and that the working state of the apparatus is stable, or for a processing step for which the processing standards are not severe, it is unnecessary to perform the 100% inspection, thereby lowering the production efficiency, even while the sampling inspection is carried out in spite of the 100% inspection.

The sampling inspection contains a lot sampling inspection, an in-lot wafer sampling inspection, an in-wafer chip sampling inspection, an in-chip element sampling inspection, etc. In the in-lot wafer sampling inspection, a predetermined number of wafers located at predetermined positions are sampled from 25 wafers constituting one lot and inspected. For example, when the first processed wafer and the last processed wafer are inspected, the inspection processing time in the inspection step can be shortened to $23/25^{ths}$ that of the 100% inspection.

When many types of articles are produced in a production line, there may be cases where there are two kinds of articles, one for which the processing standards are severe, and one for which the processing standards are not severe, or where there are two kinds of articles, one of which where sudden minute differences have a great effect, and one of which where sudden minute differences have little effect, existing in the same processing step, and where these different kinds of articles are continuously but irregularly (in term kinds) processed. In such a case, if the 100% inspection is carried out, this may be an undesired inspection due to the fact that it may lower the production efficiency. Further, if a sampling inspection is merely carried out at a frequency of once per several lots, some kinds of articles may be subjected to an undesired inspection, so that the production efficiency is lowered. Further, other kinds of articles for which the inspection would be originally required may be subjected to a next processing step without being subjected to the required inspection, so that the quality of the articles are lowered. Therefore, it has conventionally been required to develop a sampling inspection managing system for performing an inspection at a suitable inspection frequency that meets the specific inspection purposes for all kinds of products.

Japanese Laid-open Patent Application No. Hei. 11-291144 discloses and proposes one of these conventional inspection systems, and it is an inspection lot managing system having sharing means to which an IF-THEN type assortment rule containing events such as facility errors, switching of products, occurrence of maintenance work, etc., is applied. However, this publication neither discloses nor teaches a method of setting an inspection frequency in accordance with the kind of products.

SUMMARY OF THE INVENTION

The present invention has been implemented in view of the foregoing circumstances, and has an object to provide a sampling inspection managing system which can check the processing result (good or defective) of each processing step at a suitable inspection frequency that meets an inspection purpose for all kind of products.

In order to attain the above object, according to the present invention, a sampling inspection managing system for making an inspection to selected lot in a inspection step in order to confirm the processing result of a processing step in a semiconductor device production line including plural processing steps and inspection step, comprising : first means for setting whether each processing step is a step of determining a sampling inspection frequency in the specific inspection step; second means for setting the inspection frequency in the specific inspection step for each kind of production to be processed for the processing step which has been set as "the step for determining the sampling inspection frequency" in the first means; third means for counting the number of lots to be processed for each kind of product for the processing step which has been set as being "the step for determining the sampling inspection frequency" in the first means; and fourth means for judging on the basis of the lot number counted in the third means, whether each lot should be inspected in the specific inspection step, and for storing the judgment result as information of each lot.

In the sampling inspection managing system, the second means sets the inspection frequency so that a judgment on "inspection is made" or "no inspection is made" is set at a frequency of once per n lots, where n represents an integer.

In the sampling inspection managing system, the third means returns the lot number to be processed to zero, and starts new counting when the lot number counted is equal to the inspection frequency n preset by the second means.

In the sampling inspection managing system, for the processing step for which "inspection is made" is set at a frequency of once per n lots in the second means, the fourth means judges "inspection is made" for the lot which the processing lot number counted by the third means is equal to the inspection frequency n set by the second means while judging "no inspection is to be made" for the other lots, and then stores the judgment result.

In the sampling inspection managing system, for the processing step which "no inspection is made" is set at a frequency of once per n lots in the second means, the fourth means judges "no inspection is made" for the lot which the processing lot number counted by the third means is equal to the inspection frequency n set by the second means, while judging "inspection is made" for the other lots, and then storing the judgment result.

In the sampling inspection managing system in the case of a processing step in which plural lots are simultaneously processed, when plural lots to be simultaneously processed are set as one batch, the first means and the second means set a batch sampling frequency so that the judgment of "inspection is to be made" or "no inspection is to be made" is set at a frequency of once per m batches, where m represents an integer, and also set a lot which lot should be inspected in the batch which the judgment of "inspection is to be made" is set.

BRIEF DESCRIPTION OF THE DRAWINGS

FIG. 1 shows a table displayed as "processing flow table" on a CRT screen of a computer for controlling a sampling inspection managing system;

FIG. 2 shows a table displayed as "sampling frequency setting table" on a CRT screen of the computer for controlling the sampling inspection managing system in a first embodiment of the present invention;

FIG. 3 is a table displayed as "processing number counter table" on the CRT screen of the computer for controlling the sampling inspection managing system in the first embodiment of the present invention;

FIGS. 4(a) to 4(c) are tables displayed as "lot table" on the CRT screen of the computer for controlling the sampling inspection managing system in the first to third embodiments of the present invention;

DETAILED DESCRIPTION OF THE PREFERRED EMBODIMENTS

Figure 5:
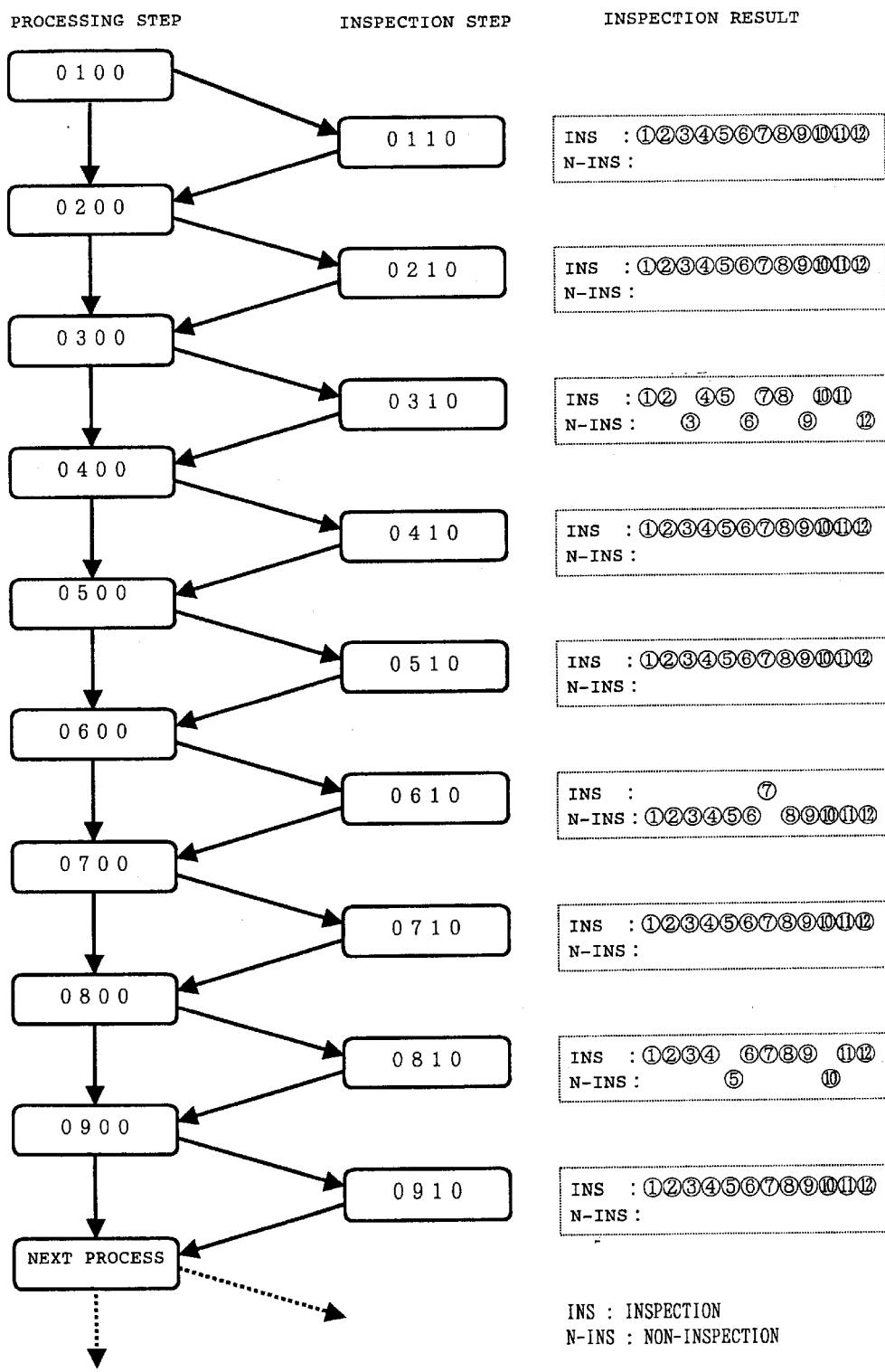
FIG. 5 is a flowchart showing inspection results of products based on the sampling inspection managing system in the first to third embodiments of the present invention.

Preferred embodiments according to the present invention will be described hereunder with reference to the accompanying drawings.

[First Embodiment]

FIGS. 1, 2, 3 and 4(a) show tables displayed on a CRT screen of a computer for controlling a sampling inspection managing system according to a first embodiment of the present invention. In the following description, the tables of FIGS. 1, 2, 3 and 4(a) are referred to as "processing flow table", "sampling frequency setting table", "processing number count table" and "lot table", respectively. The sampling inspection managing system of this embodiment is a system for selecting any lot and conducting an inspection on the lot in a specific inspection step to check whether a processing result of a processing step is good or defective in a semiconductor device production line comprising plural processing steps and inspection steps.

The sampling inspection managing system of this embodiment will be described in more detail in connection with a case where on the assumption of a production line in which twenty five wafers are set as one lot and plural kinds of articles (product 1, product 2, product 3) are to be manufactured, particularly the product 1 is passed through a processing step 0300.

First, a preset is made for each processing step on the processing flow table (FIG. 1) serving as a display frame representing first means of whether the processing step is a step for determining a sampling inspection frequency of a specific inspection step. When each processing step is completed, a check is made of the processing flow table as to whether the processing step is the step of determining the sampling inspection frequency of the specific inspection step. In this embodiment, for the product 1, the processing step 0300 is the sampling inspection frequency determining step. In this case, the specific inspection step is an inspection step 0310 described as "judgment" on the processing flow table.

Further, for the processing step which is judged as "the sampling inspection frequency determining step" on the processing flow table, the inspection frequency of a specific inspection step is preset, for each kind of product to be processed, on a display frame representing second means (FIG. 2). This sampling frequency setting table is set such that the inspection frequency is represented by an integer n and "inspection is made" or "no inspection is made" is set at a frequency of once per n lots. In this embodiment, the product 1 is set to be N type and to have an inspection frequency of "3" in the processing step 0300, and this shows that the inspection is made once every three lots.

Subsequently, for the processing step set as "the sampling inspection frequency determining step", the processing number of lots (i.e., the number of lots to be processed) is counted for every kind of product on a processing number count table (FIG. 3) serving as a display frame representing third means. When the processing number counted is equal to an inspection frequency n which is preset in the sampling frequency setting table, the processing number count table returns the processing number to zero and starts counting again. In this embodiment, when a lot. corresponding to a first lot of the product 1 is passed through the processing step 0300, the processing number "1" is stored in a column for the processing step 0300 in the processing count table, and further when a lot. corresponding to a second lot of the same kind of product (product 1) is passed through the processing step 0300, the processing number "2" is stored in the column. Further, when a lot. of the same kind of product (product 1) is passed through the processing step 0300, the processing number "3" is stored in the column. In this case, since the processing number is equal to the inspection frequency "3" which is preset on the sampling inspection setting table, the processing step is returned to zero and the counting is newly started.

Subsequently, on a lot table (FIG. 4(a)) serving as a display frame representing fourth means, a judgment is made on the basis of the processing number counted on the processing count table whether each lot is a lot to be inspected in the specific inspection step, and the judgment result is stored as information for each lot. In the case of a processing step for which "inspection is made" is set at a frequency of once per n lots on the sampling frequency setting table, the lot table judges "inspection is made" for lots on which it is judged that the processing number counted by the processing count table is equal to the inspection frequency n, and judges "no inspection is made" for the other lots. These judgment results are stored. In this embodiment, the lots. , . of the product 1 are judged as "not being inspected" while the lot. of the product 1 is judged as "being inspected", and these judgment results are stored. When a lot. which is a fourth lot of the product 1 is passed through the processing step 0300, the same processing as lot. is carried out. When the processing for the lots from lot. to the lot ⑫ (twelfth lot) is completed, information of "inspection is made" for the lots. , . , ⑫ is held on the lot table, and information of "no inspection is made" for the other lots is held.

In each inspection step, a check is made of the processing flow table as to whether a product should be inspected at a sampling inspection frequency. In this embodiment, the inspection step 0310 for the product 1 is described as "judgment", and it shows that this step should be inspected at a sampling inspection frequency. Therefore, on the basis of the information of the lot table, the inspection in the inspection step 0310 for the lots. ,. ,. ,. . . . which are not required to be inspected is skipped, and the process for these lots goes to a next step. On the other hand, the lots . ,. ,. , ⑫ . . . which are required to be inspected are subjected to the inspection in the inspection step 0310 to judge whether the processing result of processing step 0300 is good or defective. Here, the "good" or "defective" of the processing result means that the processing result is within a predetermined standard value range.

As described above, the sampling inspection system of this embodiment is equipped with a processing flow table for setting for each processing step whether the processing step is a step for determining the sampling inspection frequency of a specific inspection step, a sampling frequency setting table for setting the inspection frequency of a specific inspection step for each kind of product to be processed for a processing step which is judged as "a sampling inspection frequency determining step" on the processing flow table, the processing number count table for counting the processing number of lots for every kind of product for a processing step which is set as "a sampling inspection frequency determining step", and a lot table for judging on the basis of the processing number counted by the processing number count table whether each lot is a lot to be inspected in a specific inspection step, and for storing the judgment as information of each lot, whereby the processing result of the processing step can be checked at an inspection frequency suitable for the inspection purpose for every kind of products.

[Second Embodiment]

In this embodiment, the sampling inspection managing system shown in the first embodiment will be described in connection with a case where the product 1 is passed through a processing step 0600. The processing flow table, the sampling frequency setting table and the processing number count table of the second embodiment are designed in the same construction as those of the first embodiment, and they will be described with reference to the FIGS. 1 to 3. However, the lot table of the second embodiment will be described with reference to FIG. 4(b).

Processing step 0600 is a batch processing step for processing, at the same time, plural lots as a single batch. Particularly, three lots are set as one batch in this embodiment.

First, when a check is made on the basis of the processing flow table (FIG. 1) as to whether the processing step 0600 is a step for determining the sampling inspection frequency of a specific inspection step, the processing step 0600 is judged to be set such that it is the step for determining the sampling inspection frequency, and the head lot in a batch is sampled and inspected. In this case, the specific inspection step is an inspection step 0610 which is described as "judgment" in the processing flow table.

Subsequently, when the inspection frequency is checked on the sampling frequency setting table (FIG. 2), the product 1 is set to be "N type" and to have an inspection frequency of "3" in the processing step 0600. This shows that at a frequency of once per three batches, the head lots of the corresponding batches are to be inspected.

Subsequently, the lot processing number of products is counted for each kind of product as shown in the processing count table (FIG. 3). However, since the processing step 0600 is a batch processing step, the lot processing number is not counted, but the batch processing number is counted. In this embodiment, when a first batch comprising lots. ,. ,. of the product 1 is passed through the processing step 0600, the processing number "1" is stored in the column for the processing step 0600 of the processing count table. When a second batch comprising lots. ,. ,. of the product 1 is passed through the processing step 0600, the processing number "2" is stored in the column for the processing step 0600 of the processing count table. Further, when a third batch comprising lots. ,. ,. of the same product is passed through the processing step 0600, the processing number "3" is stored in the column. In this case, since the processing number "3" is equal to the inspection frequency "3" which is preset on the sampling frequency setting table, the processing number is returned to zero and the counting is started.

On the basis of the processing number counted by the processing count table, a check is made as to whether each lot is a lot to be inspected in a specific inspection step, and the judgment result is stored as information for each lot in the lot table. The CRT screen at this time is as shown in FIG. 4(b). In this embodiment, when the processing on lots through to the lot ⑫ serving as the last lot of the fourth batch is completed, the information that "inspection is made" on the lot. serving as the head lot of the third batch and that "no inspection is made" on all the other lots is stored.

In the inspection step 0610, a check is made of the processing flow table as to whether this is a step for carrying out an inspection at a sampling inspection frequency. In this embodiment, "judgment" is described for the inspection step 0610 of the product 1, and this shows that this step should make an inspection at the sampling inspection frequency. Therefore, on the basis of the information of the lot table, processing for the lots. to. and the lots. to ⑫ which are not required to be inspected skips the inspection in the inspection step 0610 and goes to a next step, and the lot. which is required to be inspected is inspected in the inspection step 0610.

[Third Embodiment]

In this embodiment, the sampling inspection system shown in the first and second embodiment will be described in connection with a case where the product 1 is passed through a processing step 0800. The processing flow table, the sampling frequency setting table and the processing number count table of this embodiment are the same as in the first embodiment, and thus they will be described with reference to FIGS. 1 to 3. However, the lot table of this embodiment will be described with reference to FIG. 4(c).

First, when a check is made on the basis of the processing flow table (FIG. 1) whether the processing step 0800 is a step for determining the sampling inspection frequency of a specific inspection step, the processing step 0800 is found to be a step for determining the sampling inspection frequency, and the specific inspection step in this case is an inspection step 0810 described as "judgment" on the processing flow table.

Subsequently, when the inspection frequency is checked on the sampling frequency setting table (FIG. 2), the product 1 is set to be "R type" and have an inspection frequency of "5" in the processing step 0800. This shows that no inspection is made at a frequency of once per five lots.

Subsequently, the lot processing number is counted for every kind of product as shown in the processing number count table (FIG. 3). In this embodiment, when the lot. serving as the first lot of the product 1 is passed through the processing step 0800, the processing number "1" is stored in the column for the processing step of the processing count table, and when the lot. serving as the second lot of the product 1 is passed through the processing step 0800, the processing number "2" is stored in the same column. Further, when the lot. serving as the fifth lot of the same type product is passed, the processing number "5" is stored in the same column. In this case, since the processing number "5" is equal to the inspection frequency "5" which is preset on the sampling frequency setting table, the processing number is returned to zero and the counting is newly started.

On the basis of the processing number counted by the processing count table, a check is made as to whether each lot is a lot to be inspected in a specific inspection step, and the judgment result is stored as information for each lot in the lot table. The CRT screen at this time is as shown in FIG. 4(c). In this embodiment, the processing on lots through to the lot ⑫ serving as the twelfth lot of the product 1 is completed, and the information that "no inspection is made" on the lots. ,. and "inspection is made" on all the other lots is stored.

In the inspection step 0810, a check is made on the basis of the processing flow table whether this is a step for making an inspection at a sampling inspection frequency. In this embodiment, "judgment" is described for the inspection step 0810 of the product 1, and this shows that this step should make an inspection at the sampling inspection frequency. Therefore, on the basis of the information of the lot table, the processing for the lots. ,. which are not required to be inspected skips the inspection in the inspection step 0810, and goes to a next step. On the other hand, the other lots which are required to be inspected are inspected in the inspection step 0810.

FIG. 5 shows a flow chart showing the inspection results of the product 1 by the sampling inspection managing system shown in the first to third embodiments described above. In FIG. 5, 0100, 0200, 0300, . . . represent processing steps, 0110, 0210, 0310, . . . represent inspection steps, and . . . of the inspection results represent lot numbers of the product 1 flowing in the production line.

The lot tables used in the first to third embodiments are actually the same, and information displayed on the screen is renewed and held. Further, in the first to third embodiments, each processing step and an inspection step therefor are sequentially arranged. However, the processing step and the corresponding inspection step are not necessarily arranged to be sequentially carried out, and these steps may be arranged so that plural steps are sandwiched therebetween. The present invention may also be applied to such a case.

Figure 6:
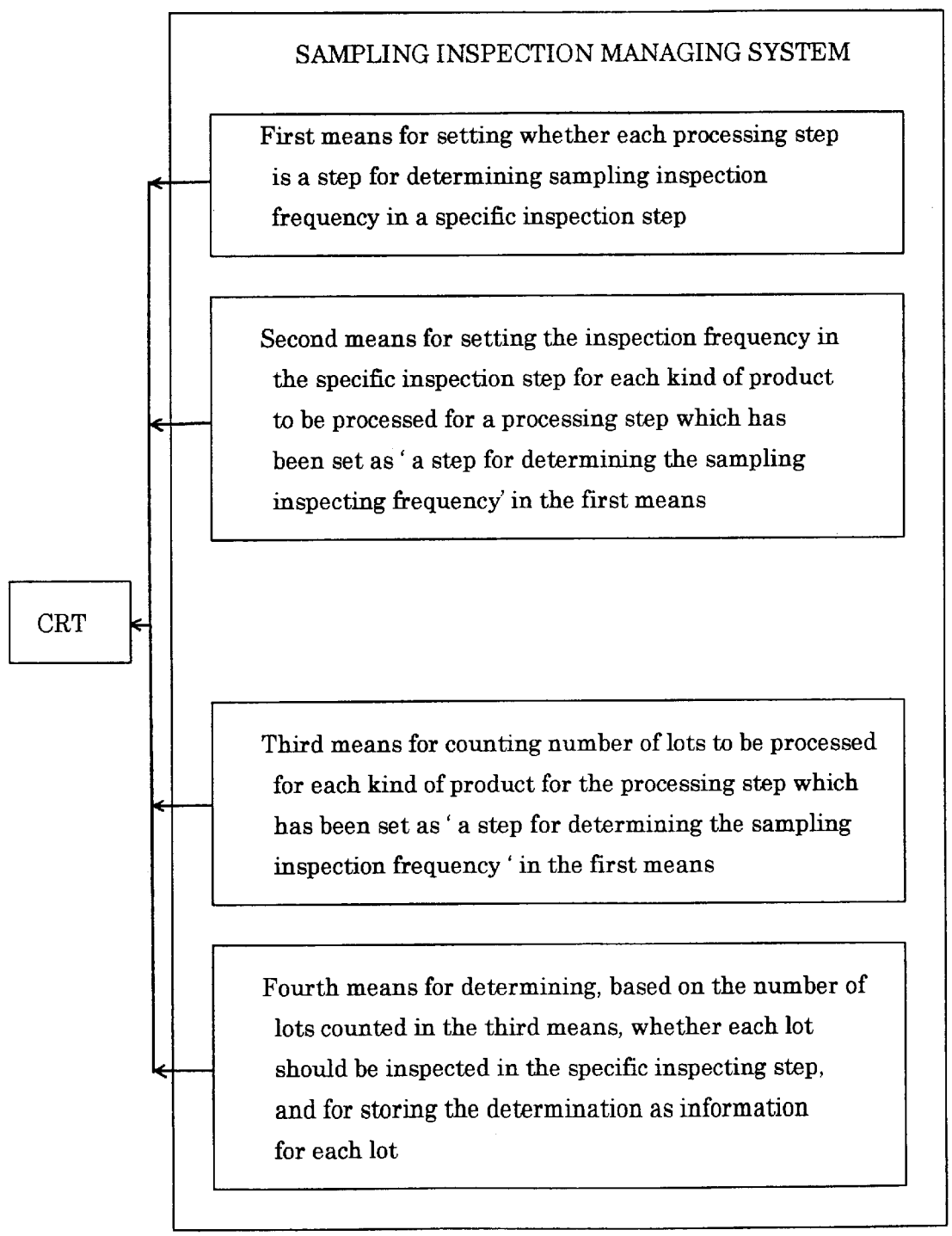
FIG. 6 is a block diagram illustrating the arrangement of elements of an apparatus according to the invention.

As described above and as shown in FIG. 6, the sampling inspection managing system according to the present invention is equipped with first means for setting for each processing step whether the processing step is a step for determining the sampling inspection frequency of a specific inspection step, second means for setting the inspection frequency of the specific step for every kind of product to be processed for the processing step which is set as "the sampling inspection frequency determining step" in the first means, third means for counting the lot processing number for every kind of product for the processing step which is set as "the sampling inspection frequency determining step" in the first means, and fourth means for judging on the basis of the processing number counted by the third means whether each lot is a lot to be inspected in the specific inspection step and for storing the judgment result as information for each lot. Therefore, a check can be made at an inspection frequency suitable for the inspection purpose for every kind of product as to whether the processing result of the processing step is good or defective, and thus the inspection can be properly carried out with the necessary and minimum load. Therefore, the equality of products and the production efficiency can be enhanced.

What is claimed is:

1. A sampling inspection managing system for inspecting a selected lot in a inspection step in order to confirm the processing result of a processing step in a semiconductor device production line including plural processing steps and inspection steps, comprising:

first means for setting whether each processing step is a step for determining sampling inspection frequency in a specific inspection step;

second means for setting the inspection frequency in the specific inspection step for each kind of product to be processed for a processing step which has been set as "a step for determining the sampling inspection frequency" in said first means;

third means for counting number of lots to be processed for each kind of product for the processing step which has been set as "a step for determining the sampling inspection frequency" in said first means; and fourth means for determining, based on the number of lots counted in said third means, whether each lot should be inspected in the specific inspection step, and for storing the determination as information for each lot, wherein said second means sets the inspection frequency so that a determination as to whether an "inspection is to be made" or "no inspection is to be made" is set at a frequency of once per n lots, where n is an integer.

2. The sampling inspection managing system as claimed in claim 1, wherein said third means returns the lot number to be processed to zero and starts to a new count when the lot number counted is equal to the inspection frequency n preset by said second means.

3. The sampling inspection managing system as claimed in claim 2, wherein, for the processing step for which "inspection is to be made" has been set at a frequency of once per n lots in said second means, said fourth means makes a determination that "inspection is to be made" for the lot for which the processing lot number counted by said third means is equal to the inspection frequency n set by said second means, while making a determination of "no inspection is to be made" for the other lots, and then stores the determinations.

4. The sampling inspection managing system as claimed in claim 2, wherein, for the processing step for which "no inspection is to be made" has been set at a frequency of once per n lots in said second means, said fourth means makes a determination that "no inspection is to be made" for the lot for which the processing lot number counted by said third means is equal to the inspection frequency n set by said second means, while making a determination that "inspection is to be made" for the other lots, and then stores the determinations.

5. A sampling inspection managing system for inspecting a selected lot in a inspection step in order to confirm the processing result of a processing step in a semiconductor device production line including plural processing steps and inspection steps, comprising:

first means for setting whether each processing step is a step for determining sampling inspection frequency in a specific inspection step;

second means for setting the inspection frequency in the specific inspection step for each kind of product to be processed for a processing step which has been set as "a step for determining the sampling inspection frequency" in said first means;

third means for counting number of lots to be processed for each kind of product for the processing step which has been set as "a step for determining the sampling inspection frequency " in said first means; and fourth means for determining, based on the number of lots counted in said third means, whether each lot should be inspected in the specific inspection step, and for storing the determination as information for each lot, wherein, when plural lots are simultaneously processed, plural lots to be simultaneously processed are set as one batch, said first means and said second means set a batch sampling frequency so that a determination as to whether "inspection is to be made" or "no inspection is to be made" is set at a frequency of once per m batches, where m is an integer, and also sets which lot should be inspected in the batch for which the determination "inspection is to be made" is set.

* * * * *